(12) United States Patent
Kim et al.

(10) Patent No.: US 8,624,331 B2
(45) Date of Patent: Jan. 7, 2014

(54) NON-VOLATILE MEMORY DEVICES, METHODS OF MANUFACTURING AND METHODS OF OPERATING THE SAME

(75) Inventors: Deok-kee Kim, Seoul (KR); Choong-rae Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 783 days.

(21) Appl. No.: 12/659,644

(22) Filed: Mar. 16, 2010

(65) Prior Publication Data

US 2011/0115049 A1 May 19, 2011

(30) Foreign Application Priority Data

Nov. 17, 2009 (KR) ........................ 10-2009-0110594

(51) Int. Cl.
*H01L 29/76* (2006.01)
(52) U.S. Cl.
USPC ............................ 257/390; 257/225; 257/246

(58) Field of Classification Search
USPC .......................................... 257/390, 225, 246
See application file for complete search history.

(56) References Cited

U.S. PATENT DOCUMENTS

| | | | |
|---|---|---|---|
| 2005/0128840 A1 | 6/2005 | Rinerson | |
| 2006/0097343 A1* | 5/2006 | Parkinson | 257/528 |
| 2008/0303013 A1* | 12/2008 | Happ et al. | 257/3 |
| 2009/0272958 A1* | 11/2009 | Ufert et al. | 257/2 |
| 2010/0012911 A1* | 1/2010 | Akinaga et al. | 257/2 |

FOREIGN PATENT DOCUMENTS

| | | |
|---|---|---|
| KR | 10-2003-0014653 | 2/2003 |
| KR | 10-2003-0023556 | 3/2003 |

* cited by examiner

*Primary Examiner* — Samuel Gebremariam
(74) *Attorney, Agent, or Firm* — Harness, Dickey & Pierce

(57) ABSTRACT

A non-volatile memory device includes: at least one horizontal electrode; at least one vertical electrode disposed to intersect the at least one horizontal electrode at an intersection region; at least one data layer disposed at the intersection region and having a conduction-insulation transition property; and at least one anti-fuse layer connected in series with the at least one data layer.

20 Claims, 13 Drawing Sheets

NON-VOLATILE MEMORY DEVICES, METHODS OF MANUFACTURING AND METHODS OF OPERATING THE SAME

CROSS-REFERENCE TO RELATED APPLICATION(S)

This application claims priority under 35 U.S.C. §119 to Korean Patent Application No. 10-2009-0110594, filed on Nov. 17, 2009, in the Korean Intellectual Property Office, the entire contents of which is incorporated herein by reference.

BACKGROUND

1. Field

Example embodiments of inventive concepts relate to semiconductor devices, for example, non-volatile memory devices capable of storing data according to a conduction-insulation transition property. Example embodiments of inventive concepts also relate to methods of manufacturing and methods of operating non-volatile memory devices.

2. Description of Conventional Art

Although sizes of conventional semiconductor devices have considerably decreased, the amount of data processed by semiconductor devices has increased. Accordingly, improvements in operating speeds and integration densities of non-volatile memory devices used in semiconductor devices are desirable.

When a non-volatile memory device having a multi-layer structure is used, more memory cells may be stacked in a space having the same size as that occupied by a non-volatile memory device having a single-layer structure. However, manufacturing and operating non-volatile memory devices having multi-layer structures are relatively complicated.

SUMMARY

At least one example embodiment of inventive concepts provides a non-volatile memory device including: at least one horizontal electrode and at least one vertical electrode. The at least one horizontal electrode and the at least one vertical electrode are disposed to intersect one another at an intersecting region. The non-volatile memory device further includes at least one data layer and at least one anti-fuse layer. The at least one data layer is disposed at the intersecting region and has a conduction-insulation transition property. The at least one anti-fuse layer is connected in series with the at least one data layer.

According to at least some example embodiments, the at least one data layer may include a transition metal oxide. For example, the at least one data layer may include a vanadium oxide, an aluminum oxide, a bismuth oxide, a titanium oxide, a niobium oxide, a nickel oxide, a copper oxide, zinc oxide, a tin oxide, a zirconium oxide, a silicon oxide, a hafnium oxide, a cobalt oxide, an iron oxide, or combinations thereof. In a more specific example, the at least one data layer may include a $V_2O_5$, $VO_2$, VO, or combinations thereof. The at least one anti-fuse layer may include oxide layers, nitride layers, oxynitride layers, or combinations of the layers. The at least one data layer may have a threshold voltage $V_{TH}$ that is less than a breakdown voltage $V_{AB}$ of the at least one anti-fuse layer.

According to at least some example embodiments, the at least one anti-fuse layer may be interposed at the intersecting region between the at least one data layer and the at least one horizontal electrode.

According to at least some example embodiments, the at least one anti-fuse layer may be interposed at the intersecting region between the at least one data layer and the at least one vertical electrode.

At least one of the data layers and the anti-fuse layers may have a pattern at the intersecting region.

According to at least some example embodiments, one or more of the at least one horizontal electrode and the at least one vertical electrode may include one or more trenches at the intersecting region. One or more of the at least one data layer and the at least one anti-fuse layer may be disposed in the one or more trenches.

According to at least some example embodiments, one or more of the at least one data layer and the at least one anti-fuse layer may be disposed to surround the at least one vertical electrode. The at least one horizontal electrode and the at least one vertical electrode may be disposed to cross each other perpendicularly or substantially perpendicularly.

The at least one horizontal electrode may include a first semiconductor having a first conductive type. The at least one vertical electrode may include a second semiconductor having a second conductive type. The second conductive type may be different from the first conductive type.

The at least one horizontal electrode, the at least one vertical electrode, or both may include: polysilicon, tungsten (W), aluminum (Al), copper (Cu), molybdenum (Mo), titanium (Ti), tantalum (Ta), ruthenium (Ru), platinum (Pt), palladium (Pd), nickel (Ni), gold (Au), silver (Ag), beryllium (Be), bismuth (Bi), hafnium (Hf), indium (In), manganese (Mn), molybdenum (Mo), lead (Pb), rhodium (Rh), rhenium (Re), tellium (Te), zinc (Zn), zirconium (Zr), cobalt (Co), iridium (Ir), platinum (Pt), an alloy thereof, an oxide thereof, a nitride thereof, a silicide thereof, or a combination thereof.

At least one other example embodiment of inventive concepts provides a non-volatile memory device including: a plurality of horizontal electrodes stacked in a plurality of layers; and a plurality of vertical electrodes formed in a plurality of rows disposed to intersect the plurality of horizontal electrodes at intersecting regions. The non-volatile memory device further includes: a plurality of data layers and a plurality of anti-fuse layers. Each of the plurality of data layers is disposed at a corresponding intersecting region and has a conduction-insulation transition property. The plurality of anti-fuse layers are connected in series with the plurality of data layers.

According to at least some example embodiments, the plurality of data layers may extend across the stacked layers of the plurality of horizontal electrodes. The plurality of anti-fuse layers may extend across the stacked layers of the plurality of horizontal electrodes. Each of the plurality of horizontal electrodes may include a plurality of first horizontal electrodes and a plurality of second horizontal electrodes that are spaced apart from each other.

At least one other example embodiment of inventive concepts provides a non-volatile memory device including: first and second conductive layers that face each other. The non-volatile memory device further includes a plurality of data layers and a plurality of anti-fuse layers. Each of the plurality of data layers is interposed between the first and second conductive layers and has a conduction-insulation transition property. Each of the plurality of anti-fuse layers is interposed between the first and second conductive layers and connected to the plurality of data layers.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
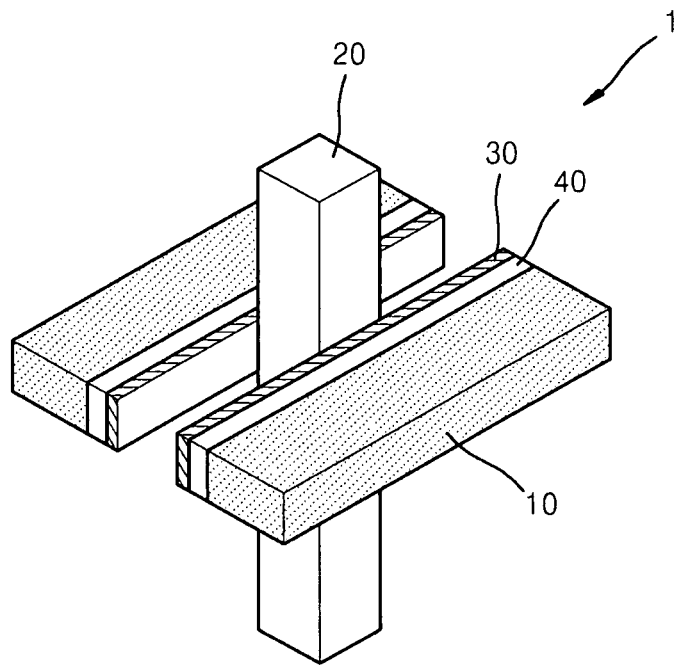
FIG. 1 is a perspective view of a unit cell of a non-volatile memory device according to an example embodiment of inventive concepts.

Reference will now be made in detail to the example embodiments illustrated in the accompanying drawings. However, inventive concepts are not limited to the example embodiments illustrated hereinafter. These example embodiments are introduced to provide easy and complete understanding of the scope and spirit of inventive concepts. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of inventive concepts.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, one or more example embodiments are described with reference to the accompanying drawings. In the drawings, transformation of forms in the drawings may be expected according to a manufacturing technique and/or tolerance. Accordingly, example embodiments are not limited to the specific forms illustrated in the drawing and may include, for example, changes in the forms which may occur during manufacturing.

FIG. 1 is a perspective view of a unit cell of a non-volatile memory device according to an example embodiment of inventive concepts.

Referring to FIG. 1, a unit cell 1 of a non-volatile memory device includes at least one horizontal electrode 10, at least one vertical electrode 20, at least one data layer 30, and at least one anti-fuse layer 40. Hereinafter, the terms 'horizontal' and 'vertical' are used to distinguish the electrodes 10 and 20 from each other, not to limit the electrodes 10 and 20.

In the unit cell 1 of FIG. 1, the horizontal electrodes 10 and the vertical electrode 20 are disposed to cross each other. In one example, a vertical electrode 20 is disposed between a pair of horizontal electrodes 10 so as to be perpendicular or substantially perpendicular to (e.g., vertical with respect to) the pair of horizontal electrodes 10. However, example embodiments are not limited to this arrangement. For example, the horizontal electrodes 10 and the vertical electrode 20 may be disposed to cross each other at a given, desired or predetermined angle.

The horizontal electrodes 10 and the vertical electrode 20 shown in FIG. 1 have the shape of a square pillar; however, example embodiments are not limited thereto. Rather, the horizontal electrodes 10 and the vertical electrode 20 may have various shapes such as a polygonal pillar or a cylindrical pillar.

The horizontal electrodes 10 and the vertical electrode 20 may be formed of, for example, semiconductor layers such as epitaxial layers or polysilicon layers. Alternatively, the horizontal electrodes 10 and the vertical electrode 20 may be formed of a metal layer including tungsten (W), aluminum (Al), copper (Cu), molybdenum (Mo), titanium (Ti), tantalum (Ta), ruthenium (Ru), platinum (Pt), palladium (Pd), nickel (Ni), gold (Au), silver (Ag), beryllium (Be), bismuth (Bi), hafnium (Hf), indium (In), manganese (Mn), molybdenum (Mo), lead (Pb), rhodium (Rh), rhenium (Re), tellium (Te), zinc (Zn), zirconium (Zr), cobalt (Co), iridium (Ir), platinum (Pt) an alloy thereof, an oxide thereof, a nitride thereof, a silicide thereof, combinations thereof or the like. In addition, each of the horizontal electrodes 10 and the vertical electrode 20 may be formed of a single layer or multi-layer structure. The multi-layer structure has a stacked layer structure. The materials of the horizontal electrodes 10 and the vertical electrode 20 are not limited to the above examples.

According to at least the example embodiment shown in FIG. 1, the at least one data layer 30 is disposed at intersecting regions where the horizontal electrodes 10 and the vertical electrode 20 intersect each other. More specifically, in FIG. 1, a data layer 30 is disposed to extend along each side wall of the horizontal electrodes 10 that faces the vertical electrode 20. Alternatively, a data layer 30 may be disposed along each side wall of the vertical electrode 20 at which a horizontal electrode 10 is formed. The shape of the data layers 30 illustrated in FIG. 1 are only examples, and the data layer 30 may have other shapes as will be described more fully with reference to FIGS. 2A through 2C. The data layers 30 may store data by varying the electrical resistance thereof, and controlling a flow of electrical current between the horizontal electrodes 10 and the vertical electrode 20.

The data layers 30 may be conductive or variable resistance materials, which have a resistance that changes according to an applied voltage. In one example, the data layers 30 may include a metal-insulation transition (MIT) material, which has a resistance that changes according to an applied voltage. In another example, the data layer 30 may include a transition metal oxide such as a vanadium oxide, an aluminum oxide, a bismuth oxide, a titanium oxide, a niobium oxide, a nickel oxide, a copper oxide, zinc oxide, a tin oxide, a zirconium oxide, a silicon oxide, a hafnium oxide, a cobalt oxide, an iron oxide, combinations thereof or the like. In a more specific example, the data layer 30 may include $V_2O_5$, $VO_2$, VO, or combinations thereof.

Alternatively, the data layers 30 may include a phase change resistance material having a high-resistance state and a low-resistance state according to a crystalline state of the phase-change resistance material, or a calcogenide compound. The above-described materials of the data layers 30 are only examples and example embodiments are not limited thereto.

When the data layers 30 are conductive layers, a diode junction may be formed between the horizontal electrodes 10 and the vertical electrode 20, thereby resulting in a rectification property there between. In this example, the horizontal electrodes 10 may include first semiconductors of a first conductive type, whereas the vertical electrode 20 may include a second semiconductor of a second conductive type. The second conductive type may be different from the first conductive type. In one example, the first conductive type and the second conductive type may be n-type and p-type, respectively, or vice versa.

Still referring to FIG. 1, an anti-fuse layer 40 may be optionally disposed at each intersecting region where the horizontal electrodes 10 and the vertical electrode 20 intersect each other. In the example embodiment shown in FIG. 1, an anti-fuse layer 40 is interposed between each horizontal electrode 10 and corresponding data layer 30. The vertical electrode 20 and the data layers 30 are electrically connected to each other.

In more detail with regard to FIG. 1, each anti-fuse layer 40 is disposed to extend along the side wall of a corresponding one of the horizontal electrodes 10 that faces the vertical electrode 20. However, the anti-fuse layers 40 may be disposed on the side walls of the vertical electrode 20. The locations of the data layers 30 and the anti-fuse layers 40 are only examples and example embodiments are not limited thereto. For example, the locations of the data layers 30 and the anti-fuse layers 40 may be reversed. In one example, the data layers 30 and the anti-fuse layers 40 may be adjacent to the horizontal electrodes 10 and the vertical electrode 20, respectively. In this example, the horizontal electrodes 10 and the data layers 30 may be electrically connected to each other. The relative locations of the data layers 30 and the anti-fuse layers 40 may also be applied to other example embodiments, which will be described in more detail below. Although not illustrated, a conductive layer including a conductive material (e.g., a metal) may be interposed between the data layers 30 and the anti-fuse layers 40. The conductive layer may function as an electrode.

Still referring to FIG. 1, the anti-fuse layers 40 may function as an anti-fuse. For example, each of the anti-fuse layers 40 may include an insulating material of which insulating property is lost in response to an applied voltage. Accordingly, the non-volatile memory device may be used as a one-time programmable (OTP) memory because the insulating property of the anti-fuse layers 40 material is not recovered. OTP memory may be used in products requiring relatively significant memory capacity. According to at least some example embodiments, the anti-fuse layers 40 may include an oxide, a nitride, an oxy-nitride, or combinations thereof. The anti-fuse layers 40 may include a silicon oxide, a silicon nitride, a silicon oxy-nitride, or combinations thereof. Also, the anti-fuse layers 40 may include a transition metal oxide, such as, an aluminum oxide, a tantalum oxide, a hafnium oxide, a lanthanum oxide, a bismuth oxide, a titanium oxide, a niobium oxide, a nickel oxide, a copper oxide, a zinc oxide, a tin oxide, a zirconium oxide, a cobalt oxide, an iron oxide, or combinations thereof. The anti-fuse layers 40 may be single layers including any one of the materials described above, multi-layer structures including a plurality of stacked single layers, or more complex layer structures including at least two of the above-described materials. The materials for forming the anti-fuse layers 40 are only examples and example embodiments are not limited thereto.

Figure 2A:
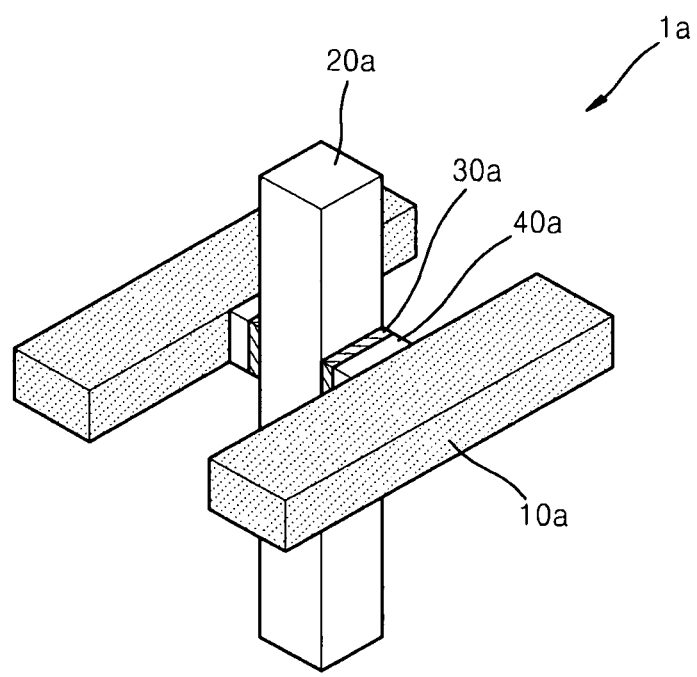
FIGS. 2A through 2C are perspective views of unit cells of non-volatile memory devices according to other example embodiments of inventive concepts.
Figure 2B:
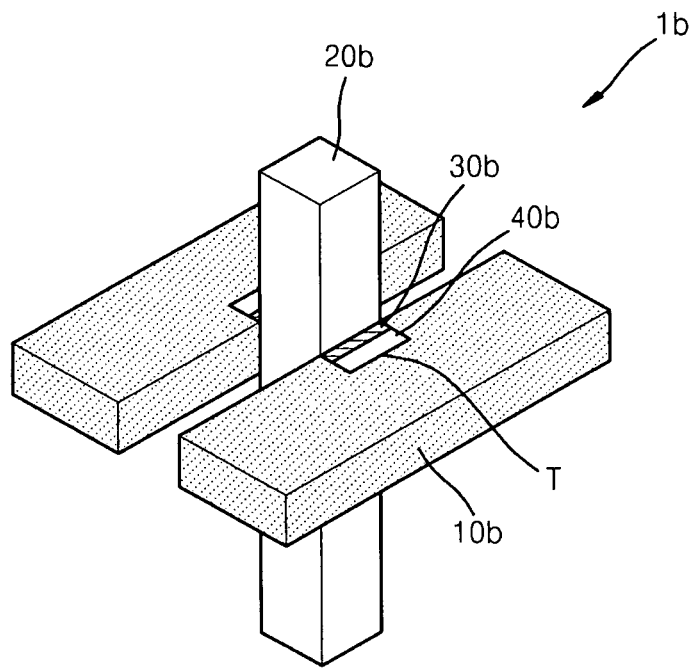
Figure 2C:
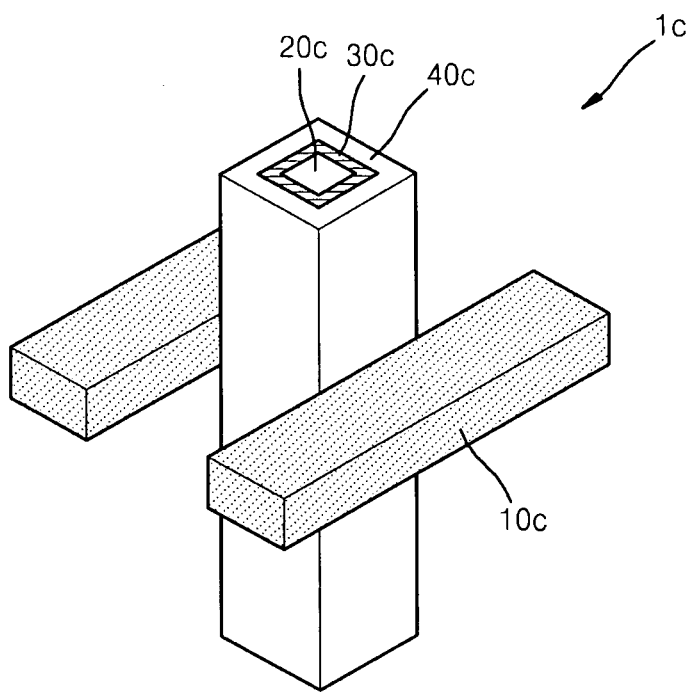

FIGS. 2A through 2C are perspective views of unit cells of non-volatile memory devices according to other example embodiments of inventive concepts. The unit cells 1a, 1b, and 1c shown in FIGS. 2A through 2C are similar to the unit cell 1 illustrated in FIG. 1, and thus, some details thereof will not be repeated.

According to the example embodiment shown in FIG. 2A, the unit cell 1a may include one or more patterned data layers 30a and one or more patterned anti-fuse layers 40a.

As shown in FIG. 2A, the unit cell 1a includes a patterned data layer 30a and a patterned anti-fuse layer 40a disposed at intersecting regions where horizontal electrodes 10a and vertical electrode 20a intersect each other. In this example, the width of the patterned data layer 30a and the patterned anti-fuse layer 40a are the same or substantially the same as the width of the vertical electrode 20a.

According to the example embodiment shown in FIG. 2B, one or more of the horizontal electrodes 10b and the vertical electrode 20b included in the unit cell 1b may include trenches T. In this example, one or more of data layers 30b and anti-fuse layers 40b may be disposed in the trenches T.

As shown specifically in FIG. 2B, a trench is formed in each horizontal electrode 10b, and a data layer 30b and an anti-fuse layer 40b are disposed in each trench T. Although not illustrated, the vertical electrode 20b may include the trenches T and one or more of data layers 30b and anti-fuse layers 40b may be disposed in the trenches T.

Also, although not illustrated, both the horizontal electrodes 10b and the vertical electrode 20b may include trenches T. In this example, one of data layers 30b and anti-fuse layers 40b may be disposed in the trenches T of the horizontal electrodes 10b, and the other of the data layers 30b and anti-fuse layers 40b may be disposed in the trenches T of the vertical electrode 20b. In at least this example embodiment, the horizontal electrodes 10b and the vertical electrode 20b are electrically insulated from each other.

According to the example embodiment shown in FIG. 2C, the unit cell 1c may include a data layer 30c and an anti-fuse layer 40c surrounding the vertical electrode 20c. Although not illustrated, the data layer 30c and the anti-fuse layer 40c may be disposed to surround each horizontal electrode 10c.

As shown specifically in FIG. 2C, a data layer 30c and an anti-fuse layer 40c surround the vertical electrode 20c.

As described above, the elements included in the unit cells 1, 1a, 1b, and 1c described with reference to FIGS. 1 through 2C are only examples and inventive concepts are not limited thereto. Characteristics of the elements may be combined.

Figure 3:
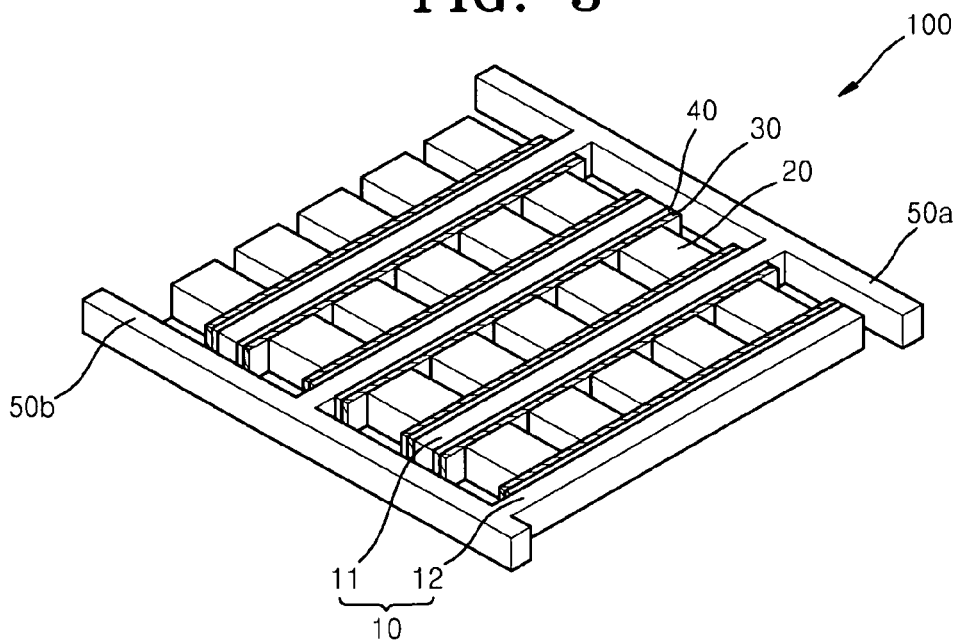
FIG. 3 is a perspective view of a non-volatile memory device according to an example embodiment of inventive concepts.

FIG. 3 is a perspective view of a non-volatile memory device according to an example embodiment of inventive concepts. In FIG. 3, the non-volatile memory device 100 includes a plurality of the unit cells 1 arranged two-dimensionally. However, example embodiments are not limited thereto and the unit cells 1a, 1b, and 1c of FIGS. 2A through 2C or combinations thereof may be included in the non-volatile memory device 100.

More specifically with regard to FIG. 3, the non-volatile memory device 100 includes a plurality of the horizontal electrodes 10, a plurality of the vertical electrodes 20, a plurality of data layers 30, and a plurality of anti-fuse layers 40.

The horizontal electrodes 10 and the vertical electrodes 20 are disposed to cross each other. For example, the vertical electrodes 20 are disposed between pairs of horizontal electrodes 10 so as to be vertical relative to the horizontal electrodes 10 or to cross each other by a given, desired or predetermined angle. The vertical electrodes 20 may be appropriately selected according to the number and length of the horizontal electrodes 10. Also, the numbers of the horizontal electrodes 10 and the vertical electrodes 20 illustrated in FIG. 3 are only examples and example embodiments are not limited thereto. In addition, in the example embodiment shown in FIG. 3, the horizontal electrodes 10 and the vertical electrodes 20 are formed as a square pillar; however, example embodiments are not limited thereto.

Still referring to FIG. 3, the data layers 30 are disposed at intersecting regions where the horizontal electrodes 10 and the vertical electrodes 20 intersect each other. For example, in FIG. 3 data layers 30 are disposed to extend along the side walls of each horizontal electrode 10. The illustrated data layers 30 are only examples and may have various forms as described with reference to FIGS. 1 through 2C.

Anti-fuse layers 40 may be optionally interposed between the horizontal electrodes 10 and each corresponding data layer 30. In the example embodiment shown in FIG. 3, the anti-fuse layers 40 are also disposed to extend along the side walls of the horizontal electrodes 10. The illustrated anti-fuse layers 40 are only examples and may have various forms as described with reference to FIGS. 1 through 2C. Also, as described above, the locations of the data layers 30 and the anti-fuse layers 40 may be reversed.

The non-volatile memory device 100 according to at least this example embodiment includes a plurality of memory cells. In this example, the horizontal electrodes 10 function as word lines and the vertical electrodes 20 function as bit lines. However, the horizontal electrodes 10 may function as bit lines and the vertical electrodes 20 may function as word lines. Hereinafter, an example configuration and operation of the non-volatile memory device 100, in which the horizontal electrodes 10 function as word lines, is described in more detail.

Still referring to FIG. 3, the horizontal electrodes 10 include first horizontal electrodes 11 and second horizontal electrodes 12 that are spaced apart from each other. The first horizontal electrodes 11 are electrically connected to a first word line 50a, whereas the second horizontal electrodes 12 are electrically connected to a second word line 50b. The first word line 50a and the second word line 50b are disposed at opposite sides of the first horizontal electrodes 11 and the second horizontal electrodes 12. For example, the first word line 50a is connected to first ends of the first horizontal electrodes 11, whereas the second word line 50b is connected to second ends of the second horizontal electrodes 12.

In the non-volatile memory device 100, one of the first horizontal electrode 11 and the second horizontal electrode 12, the vertical electrode 20, and the data layer 30 disposed there between may form a memory cell as described above with reference to FIGS. 1 through 2C. The first horizontal electrodes 11 and the second horizontal electrodes 12 may be accessed through the first word line 50a and the second word line 50b, respectively. Accordingly, access to a memory cell may be achieved by selecting one of the first word line 50a and the second word line 50b, and the vertical electrode 20.

In one example, a memory cell of the nonvolatile memory device 100 is programmed by applying a program voltage to the first word line 50a or the second word line 50b, and to the vertical electrode 20. In this example, the program voltage is greater than a threshold voltage of the anti-fuse layers 40 and the insulating properties of the anti-fuse layers 40 are lost locally. In one example, when the anti-fuse layers 40 are disposed relatively closely between the vertical electrode 20 and the first horizontal electrodes 11 or the second horizontal electrodes 12, a concentration of electrical current causes the insulating properties of the anti-fuse layers 40 to be lost locally in the anti-fuse layers 40. Accordingly, the data layers 30 adjacent to the broken anti-fuse layers 40 are conductive, and thus, may be programmed.

In another example, a memory cell is read by applying a reading voltage to the first word line 50a or the second word line 50b, and the vertical electrode 20. In this example, the reading voltage is less than the program voltage and the threshold voltage of the anti-fuse layers 40, but greater than a threshold voltage of the data layers 30. Accordingly, an electrical current flows between the horizontal electrodes 10 and the vertical electrode 20 through the data layers 30 adjacent to the anti-fuse layers 40 of which insulating properties are lost due to the program voltage, and thus, a memory cell is read.

Figure 4:
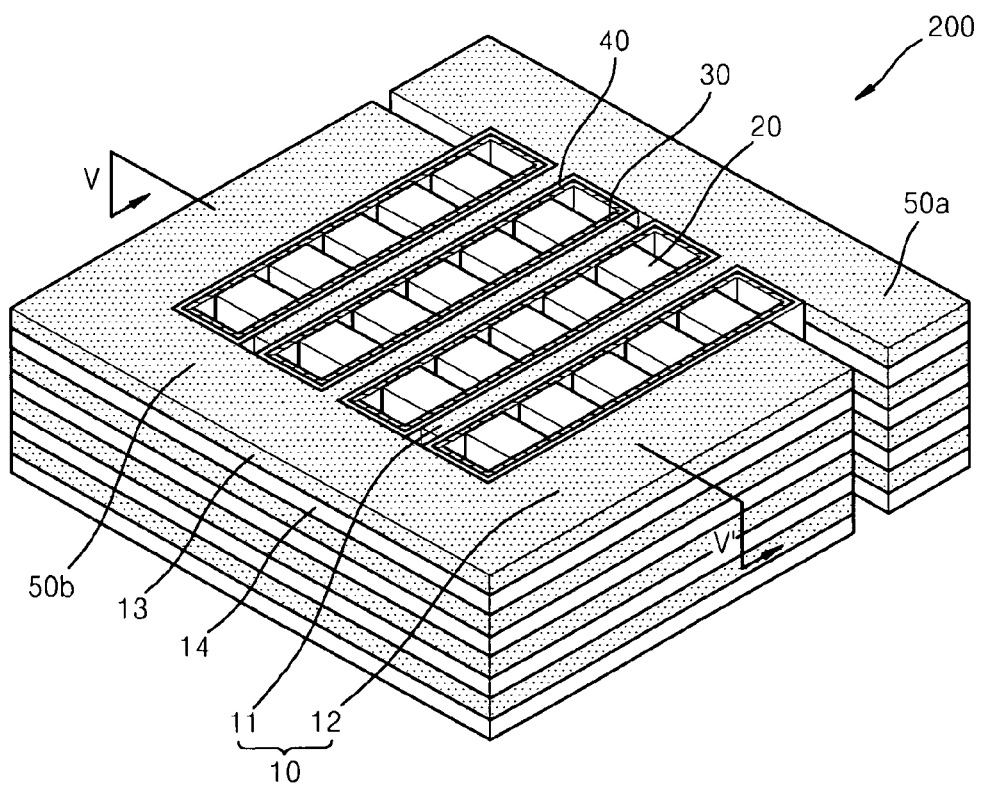
FIG. 4 is a perspective view of a non-volatile memory device having a stacked-layer structure according to another example embodiment of inventive concepts.
Figure 5:
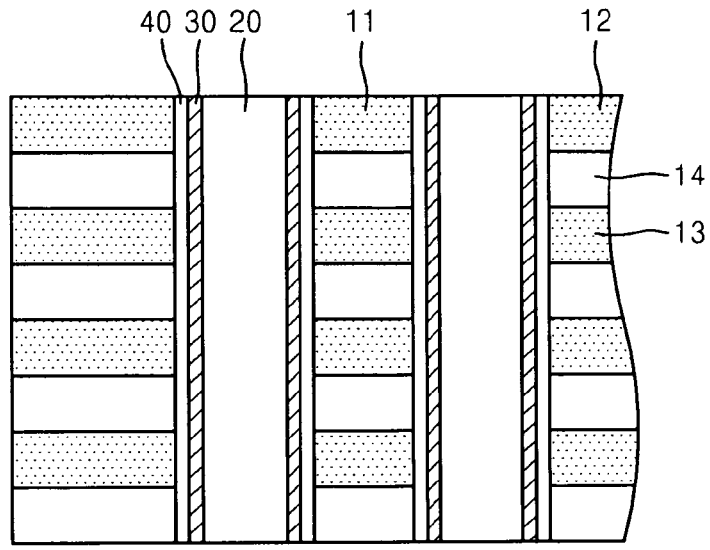
FIG. 5 is a cross-sectional diagram of the non-volatile memory device shown in FIG. 4 taken along the line V-V'.

FIG. 4 is a perspective view of a non-volatile memory device 200 having a stacked-layer structure according to another example embodiment of inventive concepts. FIG. 5 is a cross-sectional diagram taken along line V-V' in FIG. 4. The non-volatile memory device 200 includes the unit cells 1 illustrated in FIG. 1 and is similar to the non-volatile memory device 100 of FIG. 3. Thus, some details thereof will not be repeated. But, the non-volatile memory device 200 including the unit cell 1 of FIG. 1 is only an example, and example embodiments are not limited thereto. The non-volatile memory device 200 may include any of the unit cells 1a, 1b, and 1c of FIGS. 2A through 2C.

Referring to FIGS. 4 and 5, the non-volatile memory device 200 includes a plurality of the horizontal electrodes 10, a plurality of the vertical electrodes 20, and a plurality of data layers 30. The plurality of horizontal electrodes 10 are formed of a plurality of stacked layers. The plurality of the vertical electrodes 20 are formed in a plurality of rows so as to intersect with the plurality of horizontal electrodes 10 at intersecting regions. The plurality of data layers 30 are disposed at the intersecting regions where the plurality of the horizontal electrodes 10 and the plurality of the vertical electrodes 20 intersect each other.

The non-volatile memory device 200 may optionally include an anti-fuse layer 40 interposed between each of the plurality of horizontal electrodes 10 and a corresponding data layer 30. The example embodiment shown in FIGS. 4 and 5 includes the optional anti-fuse layers 40. As described above, alternatively, an anti-fuse layer 40 may be interposed between each of the plurality of vertical electrodes 20 and a corresponding data layer 30.

Still referring to FIGS. 4 and 5, the non-volatile memory device 200 is formed of a plurality of the non-volatile memory devices 100 of FIG. 3, which are stacked in a plurality of layers. More specifically, the non-volatile memory device 200 includes first conductive layers 13 and insulating layers 14 that are stacked alternately on one another. Accordingly, the plurality of the horizontal electrodes 10 (e.g., the first horizontal electrodes 11 and the second horizontal electrodes 12) may be formed of the first conductive layers 13 and the insulating layers 14 interposed between the first conductive layers 13, thereby forming a plurality of stacked layers. Similarly, the first word lines 50a and the second word lines 50b may be formed of the first conductive layers 13 and the insulating layers 14 interposed between the first conductive layers 13, thereby forming a plurality of stacked layers. The first horizontal electrodes 11 and the second horizontal electrodes 12 in each layer may be separated from one another in the same or substantially the same manner as described above with regard to FIG. 3. Similarly, the first word lines 50a and the second word lines 50b in each layer may also be separated from one another in the same or substantially the same manner as described above with regard to FIG. 3.

Still referring to FIGS. 4 and 5, the vertical electrodes 20 extend across the stacked layers of the first horizontal electrodes 11 and the second horizontal electrodes 12. Thus, the vertical electrodes 20 are shared by the stack of the first horizontal electrodes 11 and the second horizontal electrodes 12 disposed in each different layer.

The data layers 30 extend across the stacked layers of the first horizontal electrodes 11 and the second horizontal electrodes 12. Further, as shown in FIG. 4, the data layers 30 further extend onto sidewalls of the first word lines 50a and the second word lines 50b. In one example, the data layers 30 are in the form of a square tube surrounding the outer walls of the vertical electrodes 20 in each row. As described above with reference to FIGS. 1 through 2C, the data layers 30 may have various forms.

Still referring to FIGS. 4 and 5, the anti-fuse layers 40 extend across the stacked layers of the first horizontal electrodes 11 and the second horizontal electrodes 12. The anti-fuse layers 40 further extend onto the sidewalls of the first word lines 50a and the second word lines 50b. In one example, the anti-fuse layers 40 surround the data layers 30, thereby having the form of a square tube surrounding the outer walls of the vertical electrodes 20 and/or the data layers 30 disposed in each row. As described above with reference to FIGS. 1 through 2C, the anti-fuse layers 40 may have various forms. Also, the locations of the data layers 30 and the anti-fuse layers 40 may be reversed.

Example operation of the non-volatile memory device 200 according to at least this example embodiment may be inferred from the operation of the non-volatile memory device 100 of FIG. 3. The capacity of the non-volatile memory device 200 according to at least this example embodiment may be increased relatively easily by increasing the number of the memory cells, for example, the number of first horizontal electrodes 11 and second horizontal electrodes 12 or the number of stacked layers. Accordingly, the non-volatile memory device 200 according to example embodiments may have relatively high integration in the same or substantially the same plane, and thus, may be more suitable as a relatively high-capacity and/or relatively highly integrated product.

Figure 6:
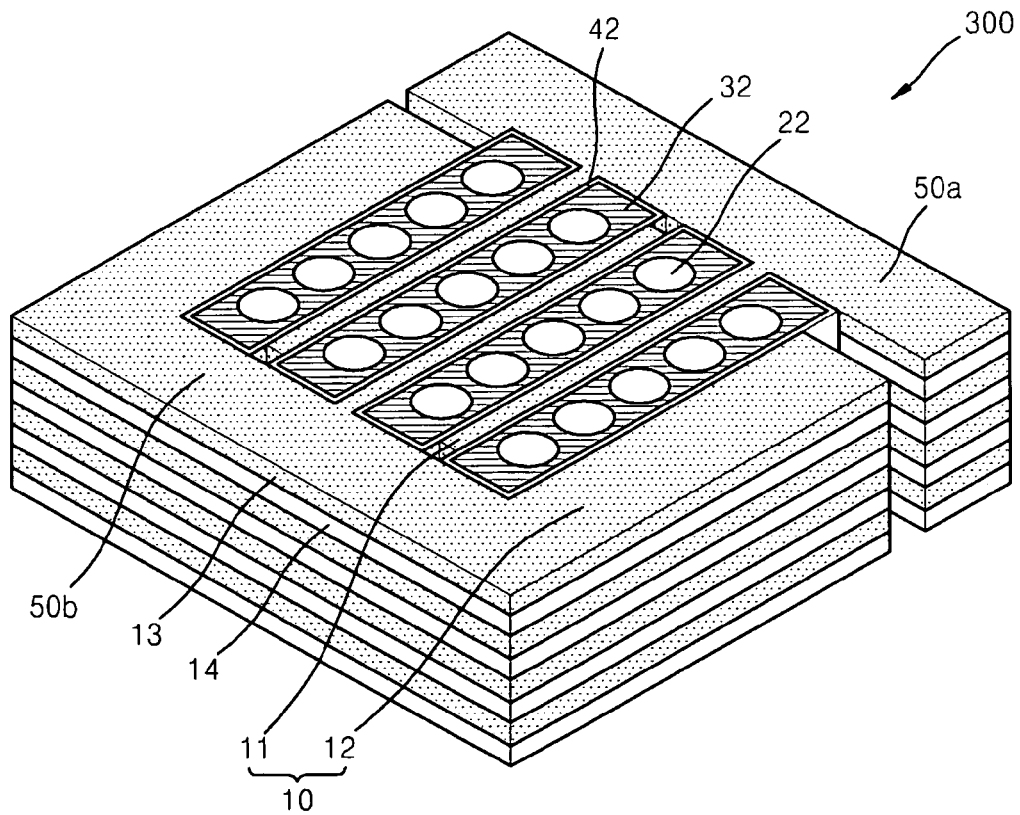
FIG. 6 is a perspective view of a non-volatile memory device having a stacked-layer structure according to another example embodiment of inventive concepts.

FIG. 6 is a perspective view of a non-volatile memory device having a stacked-layer structure according to another example embodiment of inventive concepts. The non-volatile memory device 300 shown in FIG. 6 is similar to the non-volatile memory device 200 of FIG. 4, and thus, some details thereof will not be repeated.

Referring to the example embodiment shown in FIG. 6, vertical electrodes 22 have a cylindrical form and data layers 32 are disposed to surround the vertical electrodes 22. Accordingly, the data layers 32 fill gaps between the first horizontal electrodes 11 and the second horizontal electrodes 12, and the vertical electrodes 22 are recessed into the data layers 32. Also, as described above, anti-fuse layers 42 are formed between the data layers 32 and the first horizontal electrodes 11, and between the data layers 32 and the second horizontal electrodes 12. The locations of the data layers 32 and the anti-fuse layers 42 may be reversed.

FIGS. 7A through 7G are perspective views illustrating a method of manufacturing a non-volatile memory device according to an example embodiment of inventive concepts.

Figure 7A:
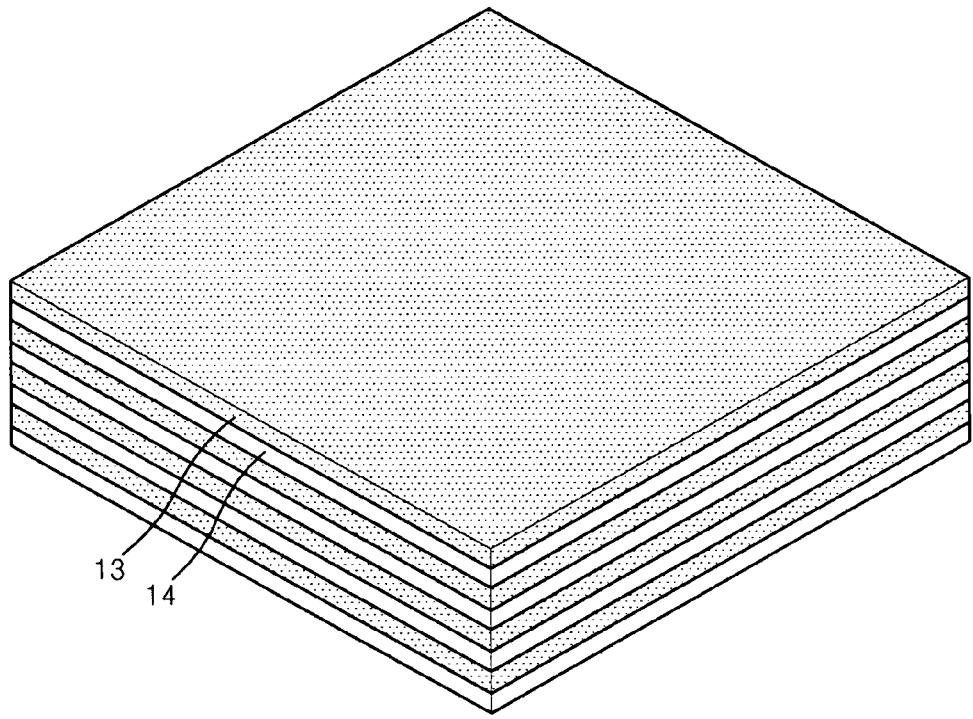
FIGS. 7A through 7G are perspective views illustrating a method of manufacturing a non-volatile memory device according to an example embodiment of inventive concepts.

Referring to FIG. 7A, a plurality of the first conductive layers 13 and a plurality of the insulating layers 14 are stacked alternately on one another. The first conductive layers 13 may be formed of, for example, semiconductor layers such as epitaxial layers or polysilicon layers, or a metal. Example metals include tungsten (W), aluminum (Al), copper (Cu), molybdenum (Mo), titanium (Ti), tantalum (Ta), ruthenium (Ru), platinum (Pt), palladium (Pd), nickel (Ni), gold (Au), silver (Ag), beryllium (Be), bismuth (Bi), hafnium (Hf), indium (In), manganese (Mn), molybdenum (Mo), lead (Pb), rhodium (Rh), rhenium (Re), tellium (Te), zinc (Zn), zirconium (Zr), cobalt (Co), iridium (Ir), an alloy thereof, an oxide thereof, a nitride thereof, a silicide thereof, or combinations thereof. The first conductive layers 13 may be doped with first conductive type impurities, for example, n-type impurities or p-type impurities.

Figure 7B:
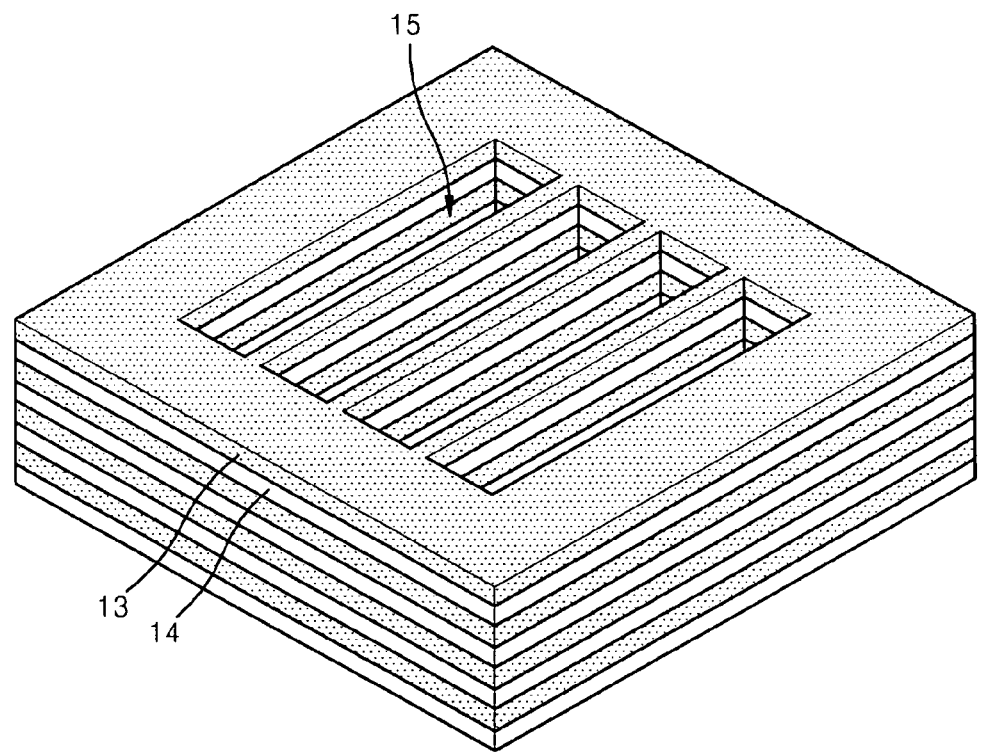

Referring to FIG. 7B, a plurality of trenches 15 are formed in the first conductive layers 13 and the insulating layers 14. The trenches 15 may be formed using a photolithography process and/or an etching process. Portions of the first conductive layers 13 disposed in a plurality of rows along the sidewalls of the trenches 15 are identified as the first and second horizontal electrodes 11 and 12 in FIG. 7F. Moreover, portions of the first conductive layers 13 disposed along the ends of the trenches 15 are identified as the first and second word lines 50a and 50b in FIG. 7F. Therefore, an appropriate number of the trenches 15 are formed according to the widths and number of the first and second horizontal electrodes 11 and 12 and first and second word lines 50a and 50b.

Figure 7C:
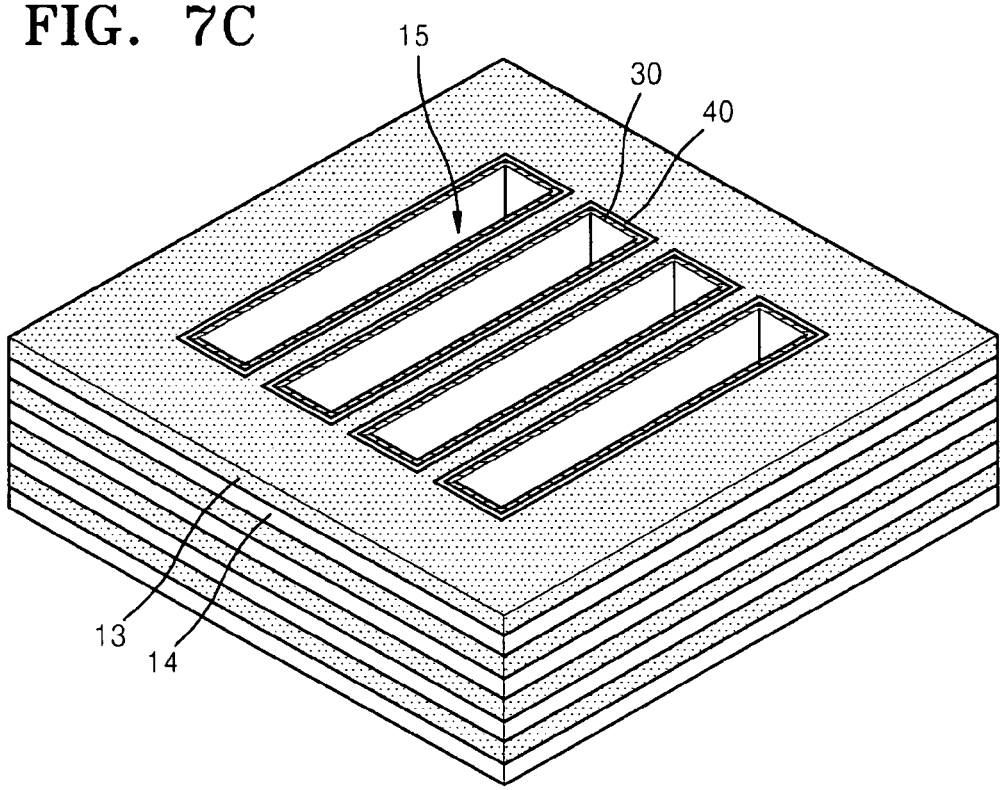

Referring to FIG. 7C, an anti-fuse layer 40 is formed in each trench 15. In this example, each anti-fuse layer 40 is formed to extend across the inner sidewalls of the first conductive layers 13 and has a given, desired or predetermined thickness so as to partially (e.g., not to completely) fill the trenches 15. The anti-fuse layers 40 may be oxide layers, nitride layers, oxy-nitride layers, or combinations of the layers and may include a material for forming an anti-fuse.

Still referring to FIG. 7C, a data layer 30 is formed on each anti-fuse layer 40 in each trench 15. In this example, the data layers 30 extend across the inner sidewalls of the first conductive layers 13 and have a given, desired or predetermined thickness to partially fill (e.g., not completely fill) the trenches 15.

Figure 7D:
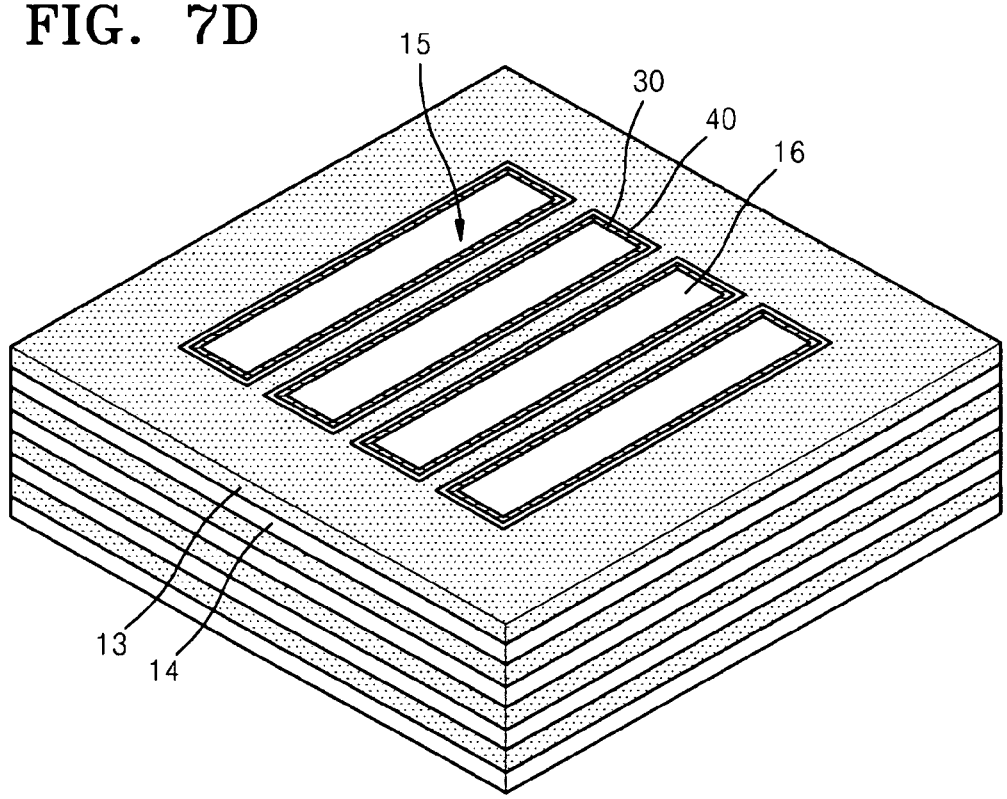
Figure 7E:
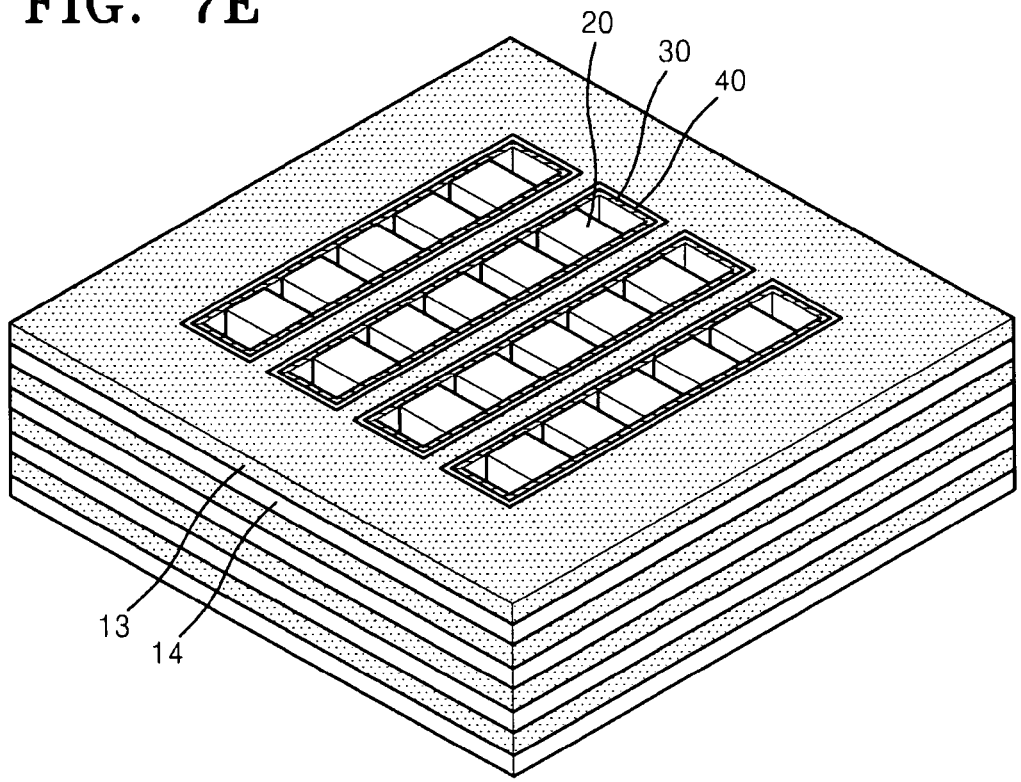

Referring to FIG. 7D, second conductive layers 16 are formed on the data layers 30 to fill the trenches 15. The second conductive layers 16 form the vertical electrodes 20 as shown in FIG. 7E. The second conductive layers 16 may be formed of semiconductor layers such as epitaxial layers or polysilicon layers, or a metal, as described with respect to the first conductive layers 13. The second conductive layers 16 may be formed of the same as, substantially the same as, or a different material from the first conductive layers 13. Also, the second conductive layers 16 may be doped with second conductive type impurities, which are opposite to the first conductive type impurities of the first conductive layers 13. The second conductive layers 16 may be formed by forming a semiconductor layer or a metal layer using chemical vapor deposition and planarizing the semiconductor layer or the metal layer. The planarization may be performed using an etchback process or chemical-mechanical polishing (CMP).

Still referring to FIG. 7E, the second conductive layers 16 are patterned to form a plurality of the vertical electrodes 20. The patterning may be performed using a photolithography process and/or an etching process. The plurality of the vertical electrodes 20 may be patterned to be electrically separated or insulated from each other.

Figure 7F:
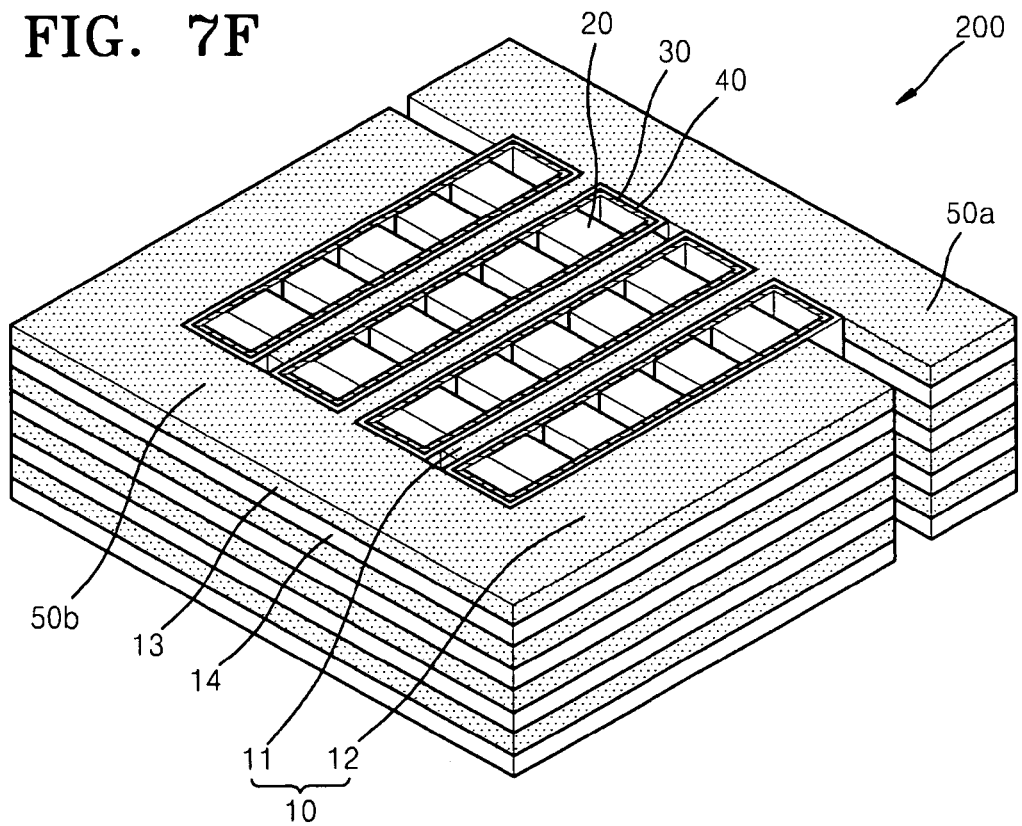

Referring to FIG. 7F, each of the first conductive layers 13 are appropriately separated to define the first and second horizontal electrodes 11 and 12 and the first and second word lines 50a and 50b. The first word line 50a is connected to the first horizontal electrodes 11, but separated from the second horizontal electrodes 12. The second word line 50b is connected to the second horizontal electrodes 12, but separated from the first horizontal electrodes 11. For example, the structure of FIG. 7F may be formed by cutting between the first horizontal electrodes 11 and the second word line 50b, and between the second horizontal electrodes 12 and the first word line 50a in the structure of FIG. 7E. The cutting may be performed using a photolithography process and/or an etching process.

Figure 7G:
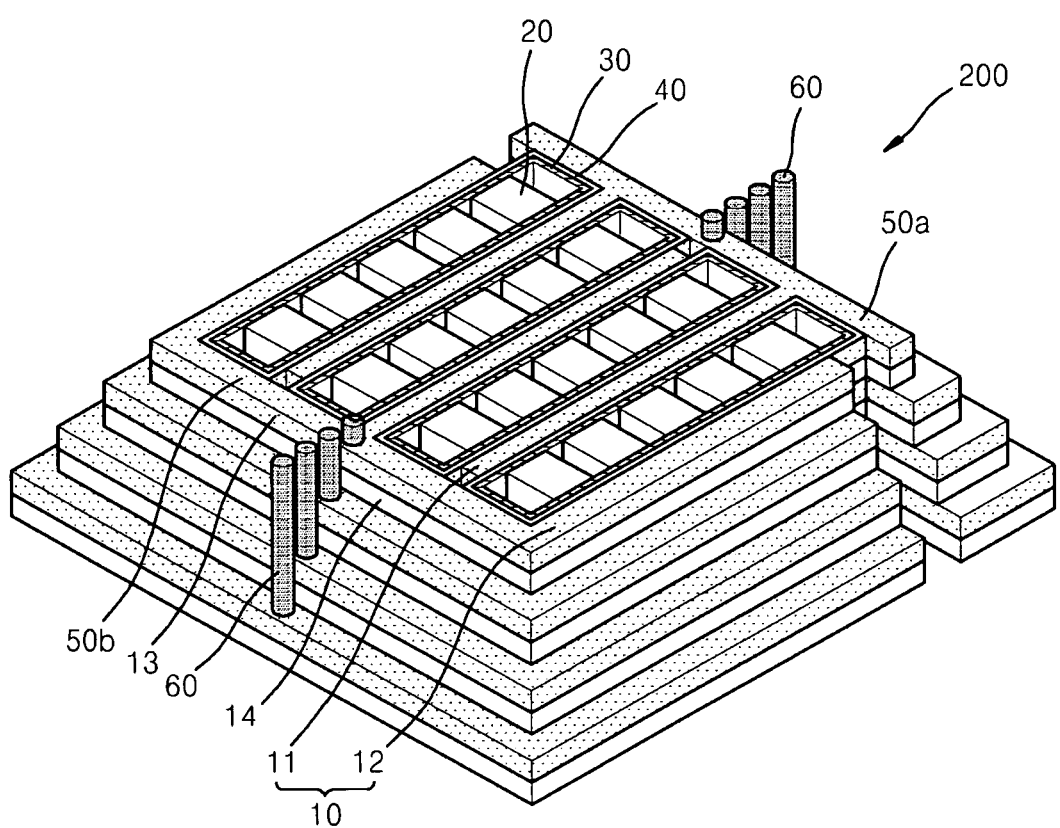

Referring to FIG. 7G, the first conductive layers 13 and the insulating layers 14 are patterned to have a stepped structure. In the stepped structure, the first conductive layers 13 are exposed. The patterning may be performed several times using a photolithography process and/or an etching process. The order of forming the stepped structure is only an example and example embodiments are not limited thereto. For example, forming of the stepped structure may be performed before, after or directly after forming the plurality of trenches 15 in the first conductive layers 13 and the insulating layers 14 as illustrated in FIG. 7B. Contacts 60, which are electrically connected to the first conductive layers 13 exposed in each step of the stepped structure, are formed on the exposed parts of the first conductive layers 13. The first and second word lines 50a and 50b and the first and second horizontal electrodes 11 and 12 are electrically connected to the outside (e.g., an external device or apparatus) by the contacts 60.

FIGS. 8A through 8E are perspective views illustrating a method of manufacturing the non-volatile memory device according to another example embodiment of inventive concepts. The manufacturing method according to at least this example embodiment is a similar to the manufacturing method illustrated in FIGS. 7A through 7G, and thus, some descriptions will not be repeated here. For example, a manufacturing operation illustrated in FIG. 8A may follow the manufacturing operations illustrated in FIGS. 7A and 7B.

Figure 8A:
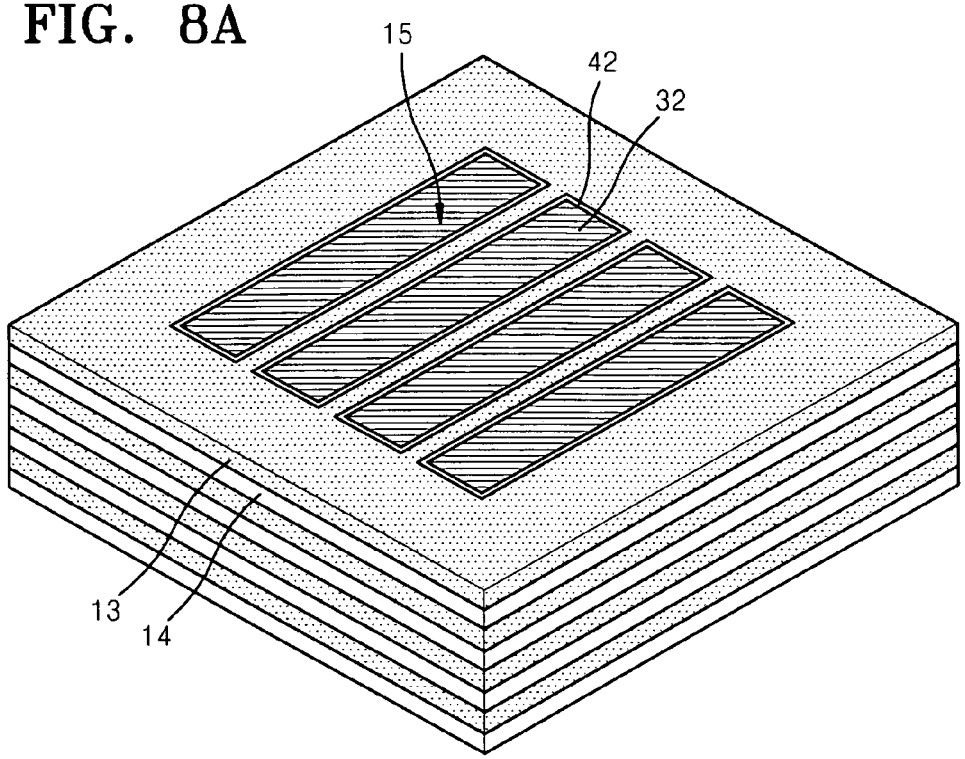
FIGS. 8A through 8E are perspective views illustrating a method of manufacturing a non-volatile memory device according to another example embodiment of inventive concepts.

Referring to FIG. 8A, anti-fuse layers 42 are formed in the trenches 15. Each anti-fuse layer 42 extends across the inner sidewalls of the first conductive layers 13 and has a given, desired or predetermined thickness to partially fill (e.g., not completely fill) the trenches 15. Data layers 32 are formed on the anti-fuse layers 42 so as to completely fill the trenches 15. The data layers 32 may be formed using, for example, a chemical vapour deposition method and a planarization process. The planarization process may be performed by using an etchback process or CMP.

Figure 8B:
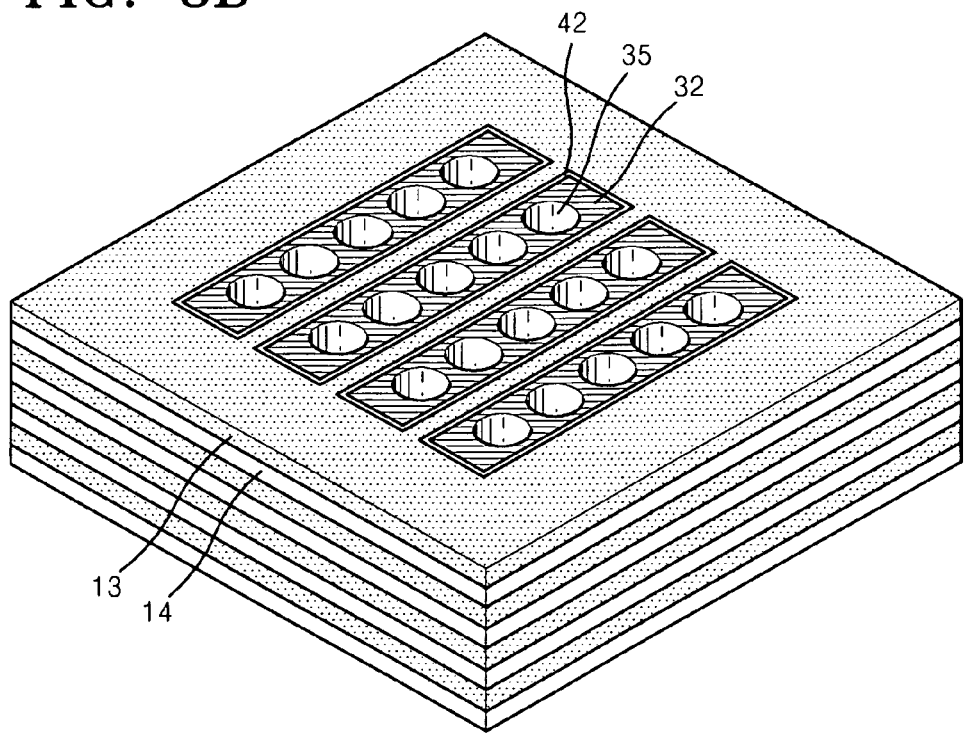

Referring to FIG. 8B, the data layers 32 are patterned to form a plurality of holes 35 in the data layers 32. The holes 35 may be formed using a photolithography process and/or an etching process. In this example, the holes 35 have a circular or substantially circular form. However, example embodiments are not limited thereto and the holes 35 may have a polygonal or elliptical form.

Figure 8C:
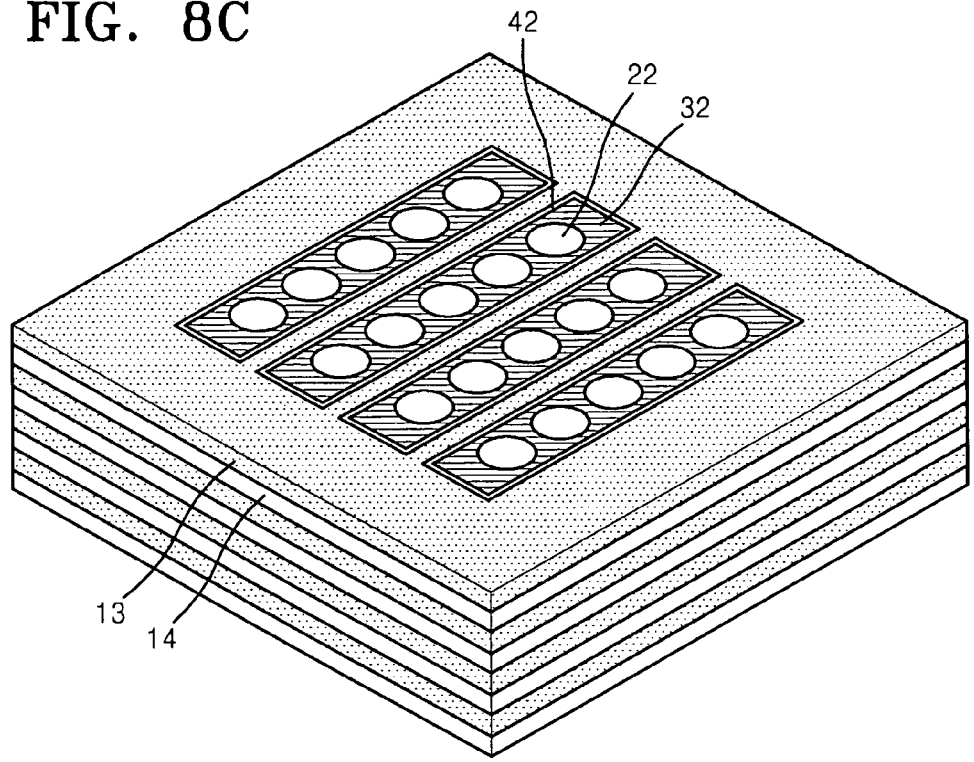

Referring to FIG. 8C, the vertical electrodes 22 are formed on the data layers 32. In one example, the vertical electrodes 22 may be formed by filling conductive materials in the holes 35 and planarizing the holes 35 using chemical vapour deposition. The vertical electrodes 22 may include second conductive type impurities.

Figure 8D:
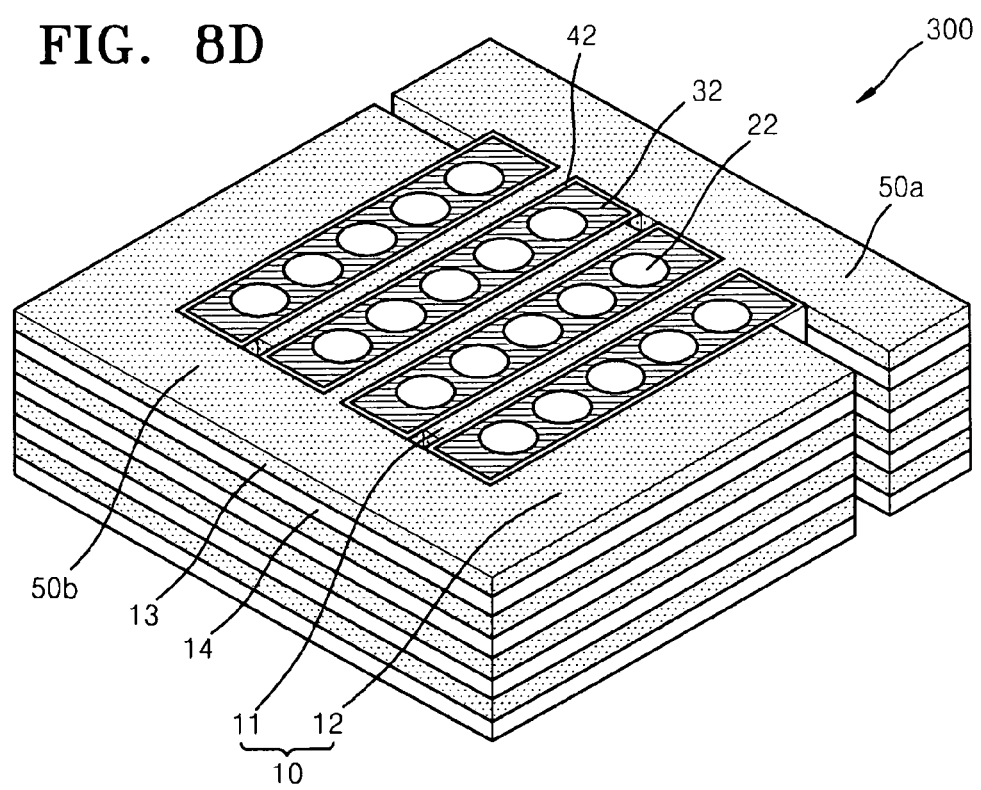

Referring to FIG. 8D, each of the first conductive layers 13 are appropriately separated to define the first and second horizontal electrodes 11 and 12 and the first and second word lines 50a and 50b. The first word line 50a is connected to the first horizontal electrodes 11, but separated from the second horizontal electrodes 12. The second word line 50b is connected to the second horizontal electrodes 12, but separated from the first horizontal electrodes 11.

Figure 8E:
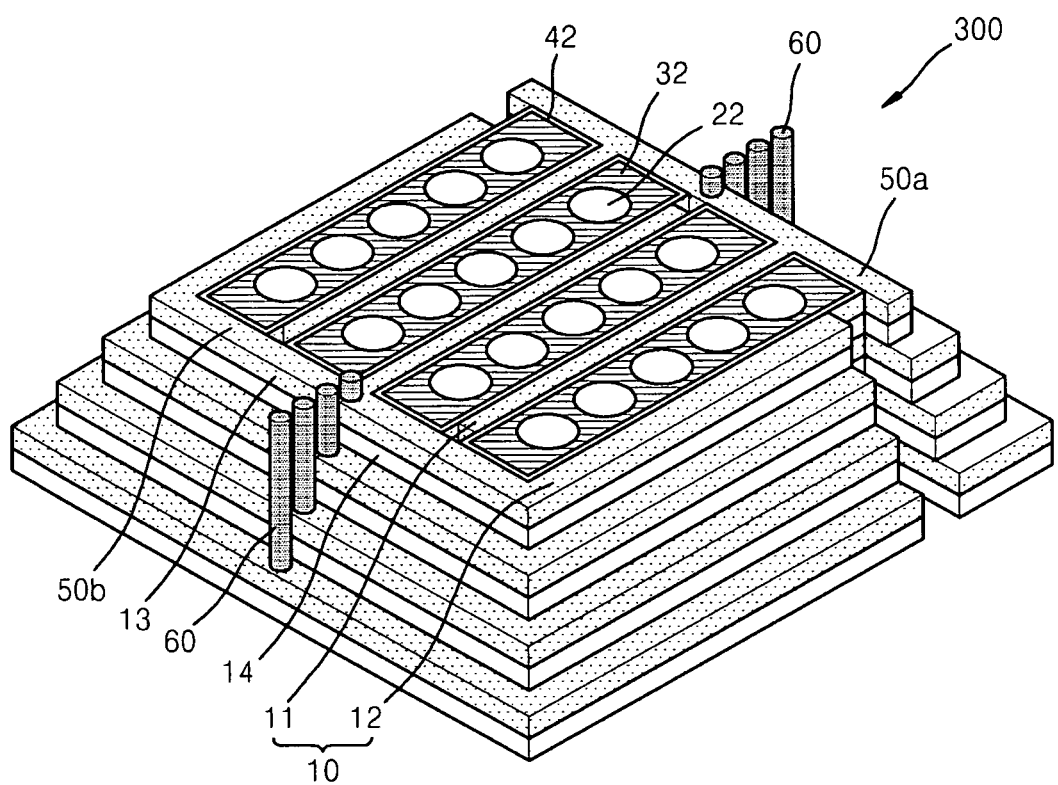

Referring to FIG. 8E, the first conductive layers 13 and the insulating layers 14 are patterned to have a stepped structure. In the stepped structure, the first conductive layers 13 are exposed. The patterning may be performed several times using a photolithography process and/or an etching process. The contacts 60, which are electrically connected to the first conductive layers 13 exposed in each step of the stepped structure, are formed on the exposed parts of the first conductive layers 13. The first and second word lines 50a and 50b and the first and second horizontal electrodes 11 and 12 are electrically connected to the outside (e.g., an external device or apparatus) by the contacts 60.

According to the manufacturing methods shown in FIGS. 7A through 7G and FIGS. 8A through 8E, memory cells having a stacked-layer structure may be formed simultaneously or concurrently. Therefore, manufacturing costs may be reduced by simplifying manufacturing operations.

Hereinafter, an example operation of a non-volatile memory device according to an example embodiment of inventive concepts will be described. In this example, the data layers 30 included in the non-volatile memory device are formed of variable resistance materials. The data layers 30 and the anti-fuse layers 40 included in the non-volatile memory device according to this example embodiment are connected to each other in series. When an external voltage is applied to the data layers 30 and the anti-fuse layers 40, a voltage $V_D$ applied to the data layers 30 and a voltage $V_A$ applied to the anti-fuse layers 40 are represented by Equation 1 shown below.

$$V_D = V R_D/(R_D + R_A),$$

$$V_A = V R_A/(R_D + R_A) \quad \text{[Equation 1]}$$

In Equation 1, $R_D$ and $R_A$ are resistances of the data layers 30 and the anti-fuse layers 40, respectively, and V is an applied external voltage.

Also, the relationship between a breakdown voltage $V_{AB}$ and a program voltage $V_p$ of the anti-fuse layers 40, the relationship between a threshold voltage $V_{TH}$ and a program voltage $V_p$ of the data layer 30, and the relationship between the breakdown voltage $V_{AB}$ and the threshold voltage $V_{TH}$ of the data layer 30 are represented by Equation 2 shown below.

$$V_{AB} \leq V_p R_A/(R_D + R_A),$$

$$V_{TH} < V_p R_D/(R_D + R_A),$$

$$V_{TH} < V_{AB} \quad \text{[Equation 2]}$$

Also, the relationship between the threshold voltage $V_{TH}$ and a reading voltage $V_R$ of the data layer 30 is represented by Equation 3 shown below.

$$V_R/2 < V_{TH} < V_R \quad \text{[Equation 3]}$$

In Equation 3, the lower limit $V_R/2$ and the upper limit $V_R$ of the threshold voltage $V_{TH}$ of the data layer 30 are in a 3-level reading operation. However, inventive concepts are not limited thereto. For example, in a 4-level reading operation, the lower limit and the upper limit of the threshold voltage $V_{TH}$ of the data layer 30 may be changed to $V_R/3$ and $2V_R/3$, respectively, or $2V_R/3$ and $V_R$, respectively. Thicknesses, types of material, contact areas, or forms of the data layer 30 and the anti-fuse layers 40 may be selected to satisfy the equations above.

Figure 9:
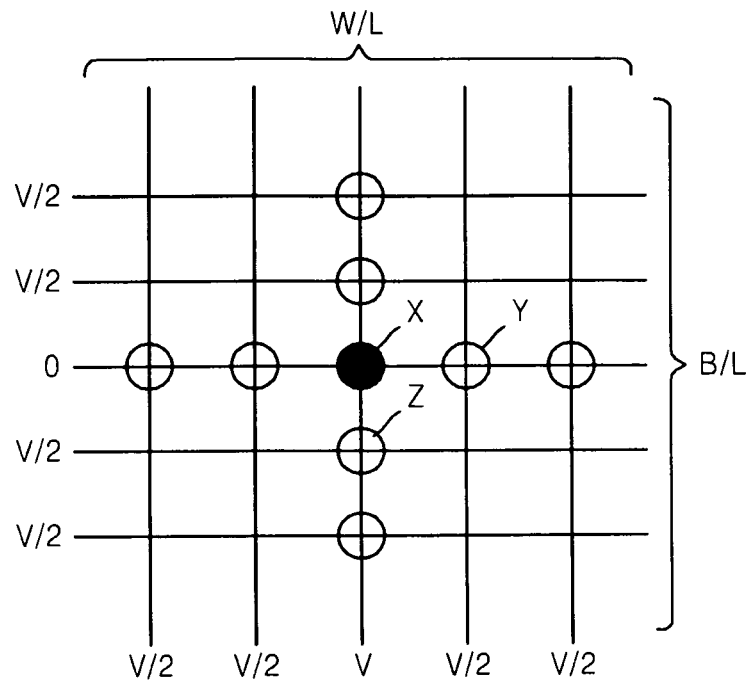
FIG. 9 schematically illustrates a method of operating a non-volatile memory device according to an example embodiment of inventive concepts.

FIG. 9 is a view schematically illustrating an example operation of a non-volatile memory device according to an example embodiment of inventive concepts.

Referring to FIG. 9, the unit cells described above are disposed in regions where word lines W/L and bit lines B/L intersect each other. A part of the unit cells may be programmed, for example, by applying a program voltage to the unit cells. According to at least this example embodiment, insulating properties of the anti-fuse layers are lost in response to the program voltage. In this example, as described above, the program voltage $V_P$ is greater than the breakdown voltage $V_{AB}$ of the anti-fuse layers. In FIG. 9, a first unit cell X, a second unit cell Y, and a third unit cell Z are programmed, whereas the other unit cells are not programmed.

A reading voltage V is then applied to read the first unit cell X. In at least this example embodiment, a 3-level reading operation, in which half of the reading voltage V is applied to non-read unit cells, is illustrated. However, inventive concepts are not limited thereto. The reading voltage V is applied to the word line W/L and the bit line B/L, which pass by the first unit cell X. For example, voltages with magnitudes of "V" and "0" may be applied to the word line W/L and the bit line B/L, respectively, which pass by the first unit cell X. Also, half of the reading voltage V (e.g., a voltage with a magnitude of "V/2") is applied to the word lines W/L and the bit lines B/L, which do not pass by the first unit cell X. Accordingly, magnitudes of voltage "V/2" and "0" are respectively applied to the word lines W/L and the bit lines B/L with respect to the second unit cell Y. As a result, a voltage of "V/2" is applied to the second unit cell Y. Also, voltages with magnitudes of "V" and V/2" are respectively applied to the word lines W/L and the bit lines B/L with respect to the third unit cell Z. As a result, a voltage of "V/2" is applied to the third unit cell Z. Moreover, a voltage of "V/2" is applied to all word lines W/L and the bit lines B/L with respect to the unit cells that are not programmed. As a result, a voltage of "0" is applied to the unit cells that are not programmed. The insulating properties of the anti-fuse layers 40 are broken down because the first unit cell X, the second unit cell Y, and the third unit cell Z are programmed. However, as described above, as the data layers 30 have the threshold voltage $V_{TH}$ that is greater than 2/V, the data layers 30 function as conductive layers in the first unit cell X, whereas the data layers 30 function as insulating layers in the second unit cell Y and the third unit cell Z. Accordingly, a memory function is available in the first unit cell X.

Figure 10:
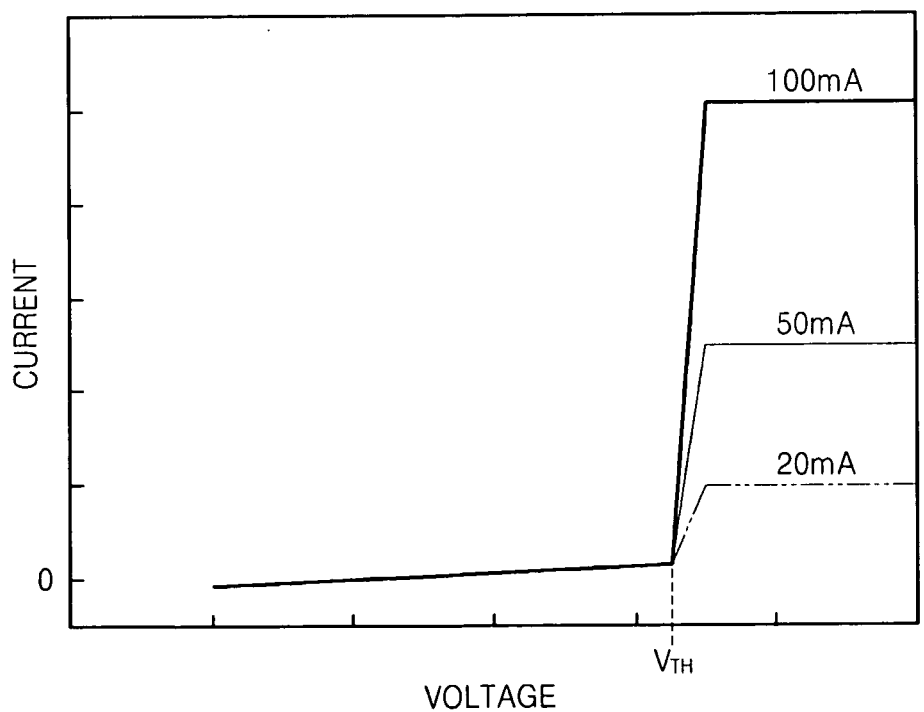
FIG. 10 is a graph showing an example voltage-current characteristic of data layers formed of variable resistive materials and included in the non-volatile memory device according to an example embodiment of inventive concepts.

FIG. 10 is a graph showing an example voltage-current characteristic of the data layers formed of variable resistance materials and included in the non-volatile memory device according to example embodiments of inventive concepts.

Referring to FIG. 10, before a voltage applied to the variable resistive materials reaches the threshold voltage $V_{TH}$, a current is nearly 0 and there is little change of current due to an increase of voltage. In other words, for example, the variable resistive materials have insulating properties before the threshold voltage $V_{TH}$ is applied. When a voltage applied to the variable resistive materials reaches the threshold voltage $V_{TH}$, a current is increased relatively significantly and the variable resistance materials have a conduction-insulation transition property or a metal-insulation transition (MIT) property. Accordingly, after the application of the threshold voltage $V_{TH}$, the variable resistive materials have a conductive property. A flowing current corresponds to an applied current. Such a current-voltage characteristic is partially shown in transition metal oxides such as vanadium oxide, $V_2O_5$, $VO_2$, and/or VO. For example, when the variable resistance materials include $V_2O_5$, an insulation characteristic shown before the threshold voltage $V_{TH}$ is relatively good (e.g., excellent) and the conduction-insulation transition characteristic is shown in a relatively narrow voltage range. When the applied voltage is removed, the variable resistance materials may again have an insulating property. Although not illustrated, when a voltage decreases from the threshold voltage $V_{TH}$, a current-voltage characteristic of the variable resistive materials may form a hysteresis loop.

Figure 11:
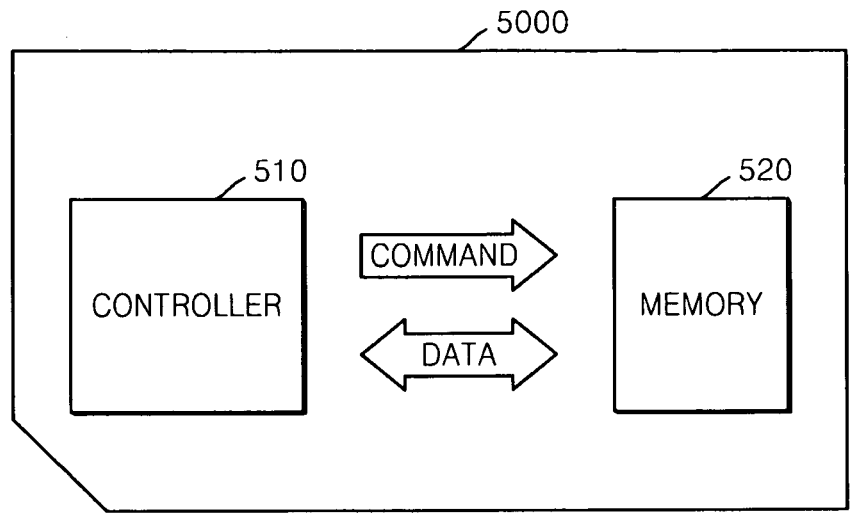
FIG. 11 is a block diagram of a card according to an example embodiment of inventive concepts.

FIG. 11 is a block diagram of a card according to an example embodiment of inventive concepts.

Referring to FIG. 11, a controller 510 and a memory 520 are disposed to send/receive electric signals to/from each other. In one example, the memory 520 sends data to the controller 510 in response to a command from the controller 510. The memory 520 may include the non-volatile memory device 100 according to an example embodiment of inventive concepts. The non-volatile memory devices according to the various example embodiments may be disposed to have a NAND or NOR architecture array corresponding to the logic gate design. Such NAND and NOR arrays are generally known in the art. The memory arrays disposed in a plurality of rows and columns may have one or more memory array bank (not shown). The memory 520 may include the memory array (not shown) or the memory array bank (not shown), all of which are known in the art. The memory card 5000 may further include conventional components or elements such as a conventional row decoder (not shown), a column decoder (not shown), input/output (I/O) buffers (now shown), and/or a control resistance materials (not shown) to drive the memory array bank (not shown), all of which are known in the art. The memory card 5000 may be used in memory devices, for example, a memory card such as a memory stick card, a smart media (SM) card, a secure digital (SD) card, a mini SD card, a multi media card (MMC), etc.

Figure 12:
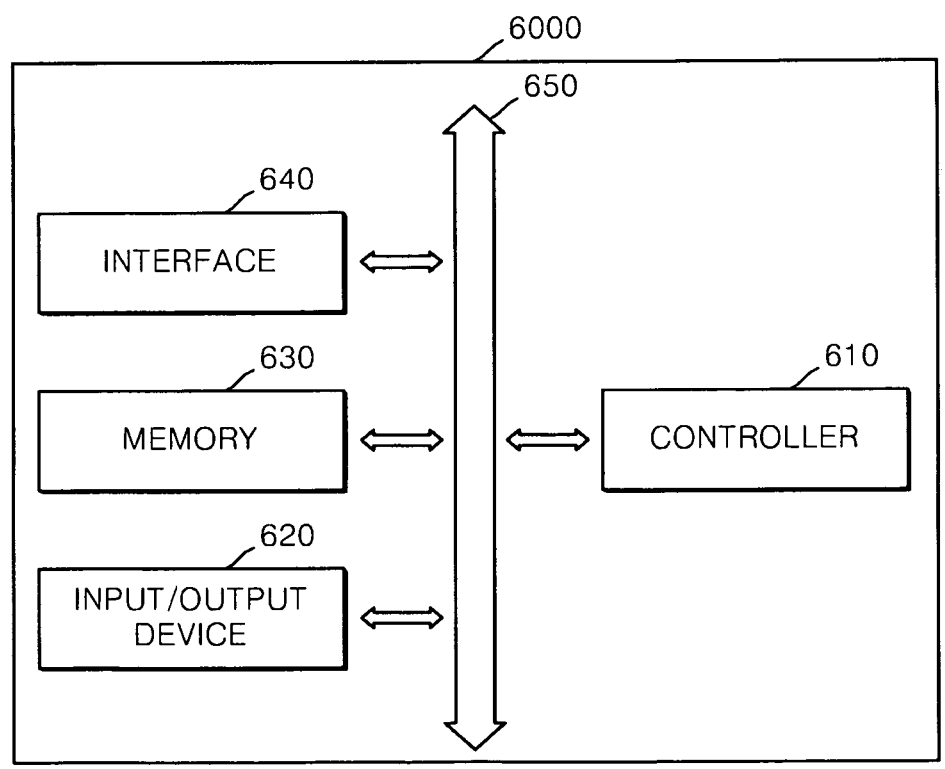
FIG. 12 is a block diagram of a system according to an example embodiment of inventive concepts.

FIG. 12 is a block diagram of a system according to an example embodiment of inventive concepts.

Referring to FIG. 12, the system 6000 includes a controller 610, an input/output device 620, a memory 630, and an interface 640. The system 6000 may be a mobile system or a system that transmits and/or receives data. The mobile system may be a personal digital assistant (PDA), a portable computer, a web tablet, a wireless phone, a mobile phone, a digital music player, a memory card, etc. The controller 610 may execute a software program and control the system 6000. The controller 610 may be a microprocessor, a digital signal processor, a microcontroller, or the like. The input/output device 630 may be used to input or output data of the system 6000. The system 6000 is connected to an external apparatus, for example, a personal computer or a network, using the input/output device 620, to send/receive data to/from the external apparatus. The input/output device 620 may be a keypad, a keyboard, a display, etc. The memory 630 may store codes and/or data for operating the controller 610 and/or may store data processed by the controller 610. The memory 630 may include a non-volatile memory device according to one or more example embodiments of inventive concepts. The interface 640 may be a data transmission path between the system 6000 and an external apparatus. The controller 610, the input/output device 620, the memory 630, and the interface 640 communicate with one another via a bus 650. For example, the system 6000 may be used for, or incorporated into, a mobile phone, a MP3 player, a navigation system, a portable multimedia player (PMP), a solid state disk (SSD), a household appliance, etc.

The foregoing is illustrative of example embodiments and is not to be construed as limiting of inventive concepts. Although example embodiments have been described, those of ordinary skill in the art will readily appreciate that many modifications are possible in example embodiments without materially departing from the novel teachings and advantages of example embodiments. Accordingly, all such modifications are intended to be included within the scope of the claims. Example embodiments are defined by the following claims, with equivalents of the claims to be included therein.

What is claimed is:

1. A non-volatile memory device comprising:
   at least one horizontal electrode being one of an n-type layer and a p-type layer, the at least one horizontal electrode disposed lengthwise in a horizontal direction;
   at least one vertical electrode being one of the n-type layer and the p-type layer that is different from the at least one horizontal electrode, the at least one vertical electrode disposed lengthwise in a vertical direction perpendicular to the at least one horizontal electrode such that the at least one vertical electrode intersects the at least one horizontal electrode at an intersecting region;
   at least one data layer disposed at the intersecting region, and having a conduction-insulation transition property; and
   at least one anti-fuse layer connected in series with the at least one data layer.

2. The non-volatile memory device of claim 1, wherein the at least one data layer includes a transition metal oxide.

3. The non-volatile memory device of claim 1, wherein the at least one data layer includes a vanadium oxide, an aluminum oxide, a bismuth oxide, a titanium oxide, a niobium oxide, a nickel oxide, a copper oxide, zinc oxide, a tin oxide, a zirconium oxide, a silicon oxide, a hafnium oxide, a cobalt oxide, an iron oxide, or combinations thereof.

4. The non-volatile memory device of claim 1, wherein the at least one data layer includes V.sub.20.sub.5, VO.sub.2, VO, or combinations thereof.

5. The non-volatile memory device of claim 1, wherein the at least one anti-fuse layer includes oxide layers, nitride layers, oxy-nitride layers, or combinations thereof.

6. The non-volatile memory device of claim 1, wherein the at least one data layer has a threshold voltage that is less than a breakdown voltage of the at least one anti-fuse layer.

7. The non-volatile memory device of claim 1, wherein the at least one anti-fuse layer is interposed at the intersecting region between the at least one data layer and the at least one horizontal electrode.

8. The non-volatile memory device of claim 1, wherein the at least one anti-fuse layer is interposed at the intersection region between the at least one data layer and the at least one vertical electrode.

9. The non-volatile memory device of claim 1, wherein at least one of the at least one data layers and the at least one anti-fuse layers have a pattern at the intersecting region.

10. The non-volatile memory device of claim 1, wherein at least one of the at least one horizontal electrode and the at least one vertical electrode include one or more trenches formed at the intersecting region, and wherein
   at least one of the at least one data layer and the at least one anti-fuse layer are disposed in the one or more trenches.

11. The non-volatile memory device of claim 1, wherein at least one of the at least one data layer and the at least one anti-fuse layer are disposed to surround the at least one vertical electrode.

12. The non-volatile memory device of claim 1, wherein the at least one horizontal electrode and the at least one vertical electrode are disposed to cross each other at a right angle.

13. The non-volatile memory device of claim 1, wherein at least one of the at least one horizontal electrode and the at least one vertical electrode include polysilicon, tungsten (W), aluminum (Al), copper (Cu), molybdenum (Mo), titanium (Ti), tantalum (Ta), ruthenium (Ru), platinum (Pt), palladium (Pd), nickel (Ni), gold (Au), silver (Ag), beryllium (Be), bismuth (Bi), hafnium (Hf), indium (In), manganese (Mn), molybdenum (Mo), lead (Pb), rhodium (Rh), rhenium (Re), tellium (Te), zinc (Zn), zirconium (Zr), cobalt (Co), iridium (Ir), platinum (Pt), an alloy thereof, an oxide thereof, a nitride thereof, a silicide thereof, or a combination thereof.

14. The non-volatile memory device of claim 1, wherein the at least one data layer has a width at least equal to a width of the at least one vertical electrode.

15. A non-volatile memory device comprising:
a plurality of horizontal electrodes stacked in a plurality of layers, each of the plurality of horizontal electrodes being one of an n-type layer and a p-type layer, the plurality horizontal electrodes disposed lengthwise in a horizontal direction;
a plurality of vertical electrodes formed in a plurality of rows, each of the plurality of vertical electrodes being one of the n-type layer and the p-type layer that is different from an associated one of the plurality of horizontal electrodes, the plurality of vertical electrodes disposed lengthwise in a vertical direction perpendicular to the plurality of horizontal electrodes such that the plurality of vertical electrodes intersects with the plurality of horizontal electrodes at intersecting regions;
a plurality of data layers, each of the plurality of data layers being disposed at a corresponding intersecting region and having a conduction-insulation transition property; and
a plurality of anti-fuse layers, each of the plurality of anti-fuse layers being connected in series with a corresponding data layer.

16. The non-volatile memory device of claim 15, wherein the plurality of data layers extend across stacked layers of the plurality of horizontal electrodes.

17. The non-volatile memory device of claim 15, wherein the plurality of anti-fuse layers extend across stacked layers of the plurality of horizontal electrodes.

18. The non-volatile memory device of claim 15, wherein each of the plurality of horizontal electrodes includes a plurality of first horizontal electrodes and a plurality of second horizontal electrodes that are spaced apart from each other.

19. A non-volatile memory device comprising:
first conductive layers, each of the first conductive layers being one of an n-type layer and a p-type layer, the first conductive layers disposed lengthwise in a horizontal direction;
second conductive layers configured to face the first conductive layers, each of the second conductive layers being one of the n-type layer and the p-type layer that is different from an associated one of the first conductive layers, the second conductive layers disposed lengthwise in a vertical direction perpendicular to the first conductive layers such that the second conductive layers intersect with the first conductive layers at intersecting regions;
a plurality of data layers, each of the plurality of data layers being interposed between the first and second conductive layers and having a conduction-insulation transition property; and
a plurality of anti-fuse layers, each of the plurality of anti-fuse layers being interposed between the first and second conductive layers and being connected to the plurality of data layers.

20. The non-volatile memory device of claim 14, wherein the at least one of anti-fuse layer has a width at least equal to the width of the at least one vertical electrode.

* * * * *